United States Patent
Shirota (10) Patent No.: US 9,136,004 B2
(45) Date of Patent: Sep. 15, 2015

(54) SEMICONDUCTOR MEMORY DEVICE AND PROGRAMMING METHOD FOR FLASH MEMORY FOR IMPROVING RELIABILTY OF INSULATING LAYER OF MEMORY CELL

(71) Applicant: Winbond Electronics Corp., Taichung (TW)

(72) Inventor: Riichiro Shirota, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 14/272,516

(22) Filed: May 8, 2014

(65) Prior Publication Data

US 2015/0003163 A1  Jan. 1, 2015

(30) Foreign Application Priority Data

Jul. 1, 2013  (JP) ................................. 2013-137997

(51) Int. Cl.
*G11C 16/04* (2006.01)
*G11C 16/10* (2006.01)

(52) U.S. Cl.
CPC ............ *G11C 16/10* (2013.01); *G11C 16/0483* (2013.01)

(58) Field of Classification Search
CPC ... G11C 16/0483; G11C 16/10; H01L 27/115
USPC ............................ 365/185.17, 185.18, 185.19
See application file for complete search history.

(56) References Cited

U.S. PATENT DOCUMENTS

| | | | |
|---|---|---|---|
| 8,520,439 B2 * | 8/2013 | Tsai et al. | 365/185.19 |
| 8,760,928 B2 * | 6/2014 | Chen et al. | 365/185.18 |
| 2013/0088920 A1 * | 4/2013 | Huang et al. | 365/185.17 |

FOREIGN PATENT DOCUMENTS

| | | |
|---|---|---|
| JP | 2009-272026 | 11/2009 |
| JP | 2011-253591 | 12/2011 |

OTHER PUBLICATIONS

"Office Action of Japan Counterpart Application", issued on Jan. 7, 2014, p. 1-p. 4.
Koyanagi Mitsumasa, "Series of Electronic Materials, Submicron Device II," Maruzen Co., Ltd., 1997, pp. 122, 125.
Seigo et al., "Series of Electronic Materials, Physics of VLSI Device," Maruzen Co., Ltd., Jul. 25, 1986, pp. 182-184.
"Response to Office Action of Japan Counterpart Application", submitted on Mar. 28, 2014, p. 1-p. 4.
"Office Action of Korean Counterpart Application," issued on May 21, 2015, with English translation thereof, pp. 1-5.

\* cited by examiner

*Primary Examiner* — Connie Yoha
(74) *Attorney, Agent, or Firm* — Jianq Chyun IP Office (57) ABSTRACT

A programming method for suppressing deterioration of an insulating layer in a memory cell is provided. In the programming method for a flash memory of the invention, a cell unit including programming units that have been programmed is electrically isolated from a bit line; a cell unit not including programming units is electrically coupled with the bit line; a programming voltage is applied to selected word lines; and a pass voltage is applied to non-selected word lines. Moreover, during a period of applying the programming voltage, carriers are generated in a P-well, and hot carriers passing through a depletion region and accelerated by an electric field are injected into the memory cell.

18 Claims, 12 Drawing Sheets

FIG.1(PRIOR ART)

|  | erase | write | read |
|---|---|---|---|
| selected WL | 0 | 15~20V | 0 |
| non-selected WL | F | 10V | 4.5 |
| SGD | F | Vcc | 4.5 |
| SGS | F | 0 | 4.5 |
| SL | F | Vcc | 0 |
| P-well | 21 | 0 | 0 |

SEMICONDUCTOR MEMORY DEVICE AND PROGRAMMING METHOD FOR FLASH MEMORY FOR IMPROVING RELIABILTY OF INSULATING LAYER OF MEMORY CELL

CROSS-REFERENCE TO RELATED APPLICATION

This application claims the priority benefit of Japan application serial no. JP2013-137997, filed on Jul. 1, 2013. The entirety of the above-mentioned patent application is hereby incorporated by reference herein and made a part of this specification.

BACKGROUND OF THE INVENTION

1. Field of the Invention

The invention relates to a semiconductor memory device and more particularly relates to a programming method for a NAND-type flash memory.

2. Description of Related Art

Figure 1:
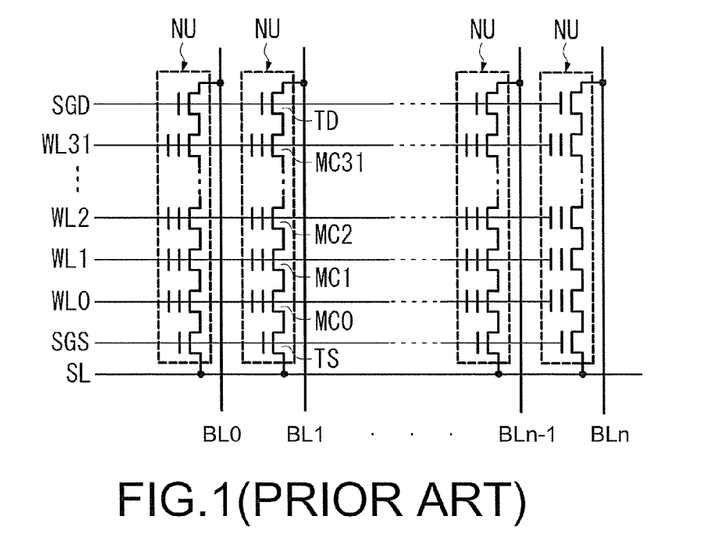
FIG. 1 is a circuit diagram illustrating a configuration of NAND strings in a flash memory.

A typical NAND type flash memory includes a memory array that is composed of a plurality of NAND strings. The NAND string includes a plurality of memory cells connected in series, and a bit line selection transistor and a source line selection transistor connected to two ends thereof. FIG. 1 is a circuit diagram illustrating a configuration of the NAND strings formed in the memory array. In a memory block, multiple NAND strings (referred to as "cell units (NU)" hereinafter) formed by connecting multiple memory cells in series are disposed in row and column directions. In the example as shown, the configuration of one cell unit (NU) includes 32 memory cells MCi (i=0, 1, . . . , 31) that are connected in series, and a bit line selection transistor TD and a source line selection transistor TS connected to two ends thereof. A drain of the bit line selection transistor TD is connected to one bit line BL corresponding thereto, and a source of the source line selection transistor TS is connected to a common source line SL. Control gates of the memory cells MCi are connected to a word line WLi. Gates of the bit line selection transistor TD and the source line selection transistor TS are respectively connected to selection gate lines SGD and SGS that extend parallel to the word line WLi.

Generally speaking, the memory cell includes a source/drain having an N-type diffusion region formed in a P-well, a tunneling oxide layer formed on a channel between the source/drain, a floating gate (a charge accumulation layer) formed on the tunneling oxide layer, and a control gate formed on the floating gate via a dielectric film. Generally, when no charge is accumulated in the floating gate, namely, data "1" is written, a threshold value is negative, and the memory cell is normally on. When charges are accumulated in the floating gate, namely, data "0" is written, the threshold value shifts toward a positive direction, and the memory cell is normally off.

Figure 2:
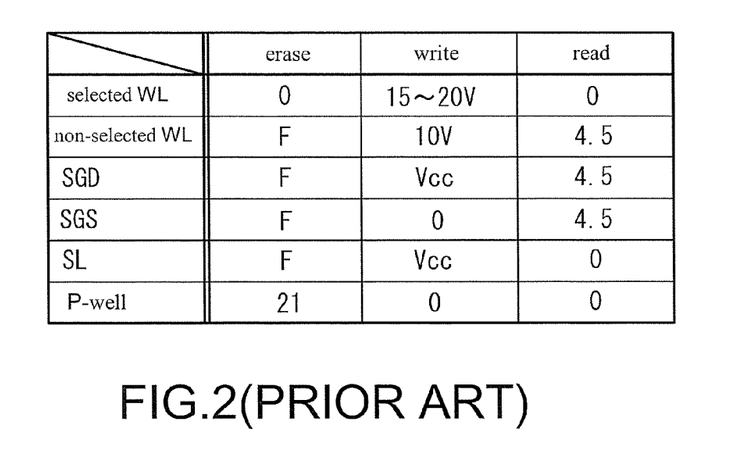
FIG. 2 is a table showing an example of bias voltages applied in each operation of the flash memory.

FIG. 2 is a table showing an example of bias voltages that are applied in each operation of the flash memory. In a reading operation, a positive voltage is applied to the bit line; a voltage is applied to selected word lines and a read pass voltage (e.g. 4.5V) is applied to non-selected word lines; a positive voltage (e.g. 4.5V) is applied to the selection gate lines SGD and SGS to turn on the bit line selection transistor TD and the source line selection transistor TS; and 0V is applied to the common source line SL. Accordingly, page data of the selected word lines is read via the bit line, and whether the threshold value of the read cell is higher than the voltage applied to the selected word lines is detected.

In a programming (writing) operation, a high-voltage programming voltage Vprg (15V~20V) is applied to the selected word lines; an intermediate potential (e.g. 10V) is applied to the non-selected word lines to turn on the bit line selection transistor TD and turn off the source line selection transistor TS; and a potential corresponding to data "0" or "1" is provided to the bit line BL. In an erasing operation, 0V is applied to the selected word lines in the block; a high voltage (e.g. 21V) is applied to the P-well; and electrons of the floating gate are extracted to a substrate to use the block as a unit for erasing data. Detailed descriptions about the NAND type flash memory may be found in Japanese patent publication No. 2011-253591.

Flash memory is required to have a certain degree of endurance (data rewriting times) or data holding characteristics. When FN (Fowler-Nordheim) tunneling current flows through the gate oxide layer, if a portion of the electrons are captured by the oxide layer and stored in the oxide layer, it is difficult for the FN tunneling current to flow through even though a voltage is applied to the control gate. Thus, the data rewriting times are limited. In addition, if the charges stored in the floating gate are released as time passes, the stored data will be lost. Therefore, it is more ideal to prevent deterioration of the characteristic of the insulating layer that surrounds the floating gate. The conventional programming method is to apply a high voltage to the control gate to render the substrate (P-well) 0V, and apply a high electric field to the tunneling oxide layer so as to inject electrons by a FN tunneling effect. However, applying high electric field to the oxide layer and reiteratively performing the programming and erasing operations may lower the reliability of the oxide layer.

SUMMARY OF THE INVENTION

The invention is directed to the aforementioned and provides a programming method and a semiconductor memory device for improving reliability of an insulating layer of a memory cell.

The invention provides a programming method adapted for a flash memory device, wherein the flash memory includes: a memory array that has a plurality of NAND type cell units formed in a first semiconductor region of a first conductive type. The programming method includes: electrically isolating the cell unit including a programming unit from a bit line corresponding thereto, and electrically coupling the cell unit not including the programming unit with a bit line corresponding thereto; applying a programming voltage to a selected word line, and applying a pass voltage to a non-selected word line; generating carriers in the first semiconductor region during a period of applying the programming voltage; and injecting hot carriers into the programming unit.

Another embodiment of the invention provides a semiconductor memory device, including: a memory array formed in a first semiconductor region of a first conductive type; and a plurality of cell units formed in the memory array, wherein the cell units include a plurality of memory cells that are connected in series, and one of the cell units includes a programming unit that has been programmed, wherein, during a programming period, the cell unit including the programming unit is electrically isolated from a bit line corresponding thereto, the cell unit not including the programming unit is coupled with a bit line corresponding thereto, a selected word line is applied with a programming voltage, a non-selected word line is applied with a pass voltage, and a carriers are generated in the first semiconductor region; and during the programming period, a depletion region is formed in the cell unit including the programming unit, and the carriers form hot carriers in the depletion region to be injected into the programming unit.

According to the invention, the programming is performed by injecting hot carriers. In comparison with using FN tunneling to inject electrons, the invention reduces the electric field applied to the insulating layer of the memory cell, and thus suppresses deterioration of the insulating layer and improves the reliability of the insulating layer.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

Embodiments of the invention are described hereinafter with reference to the drawings. It should be noted that, in order to emphasize each part of the drawings and make it easily comprehensible, the sizes of the devices in the drawings and a ratio thereof may not be consistent with the actual devices.

Figure 3:
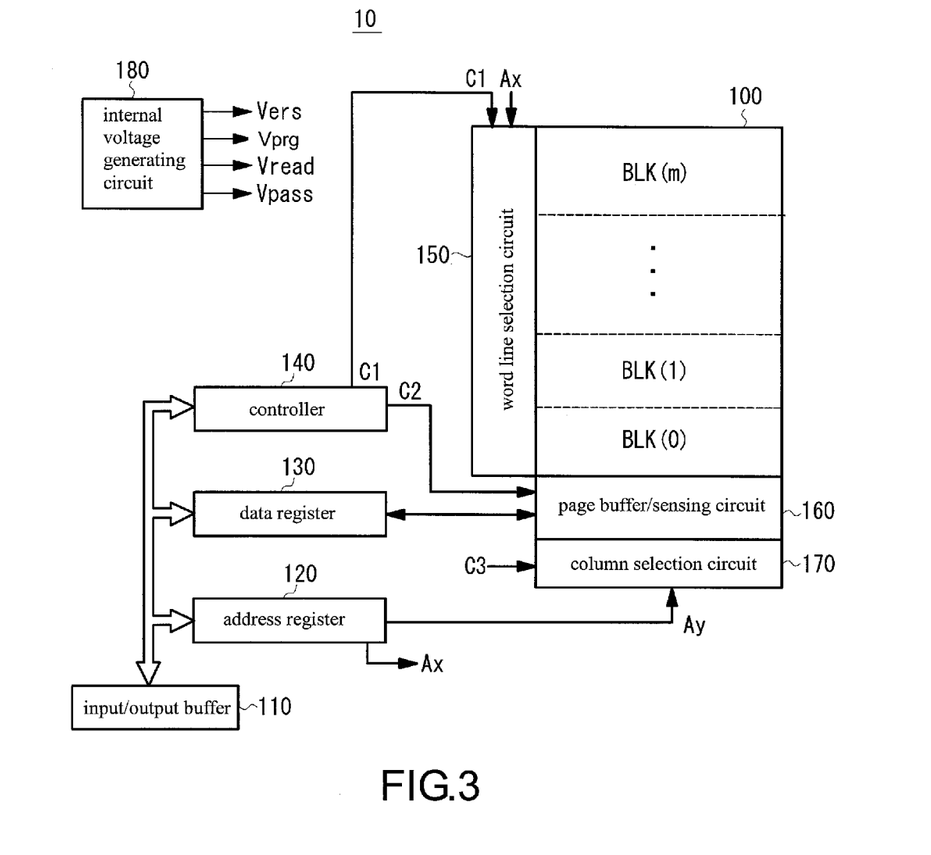
FIG. 3 is a block diagram illustrating a flash memory according to an embodiment of the invention.

FIG. 3 is a block diagram illustrating a flash memory according to an embodiment of the invention. It should be noted that the configuration of the flash memory as illustrated here is merely an example. The invention is not limited to this configuration.

With reference to FIG. 3, a flash memory 10 includes: a memory array 100 formed with a plurality of memory cells that are arranged in a column/row; an input/output buffer 110 connected to an external input/output terminal I/O for holding input/output data; an address register 120 for receiving address data from the input/output buffer 110; a data register 130 for holding input and output data; a controller 140 that provides a control signal C1, a control signal C2, and a control signal C3, etc., for controlling each part based on command data from the input/output buffer 110 and an external control signal (e.g. chip enable or address latch enable, etc., not shown); a word line selection circuit 150 for decoding row address information Ax from the address register 120 to perform selection of blocks and word lines based on a decoding result; a page buffer/sensing circuit 160 for holding data read from a page selected by the word line selection circuit 150, or for holding writing data for the selected page; a column selection circuit 170 for decoding column address information Ay from the address register 120 to select column data in the page buffer 160 based on a decoding result; and an internal voltage generating circuit 180 for generating a voltage (e.g. a programming voltage Vprg, a pass voltage Vpass, a read pass voltage Vread, and an erase voltage Vers, etc.) required for reading, programming, and erasing data.

The memory array 100 includes a plurality of memory blocks BLK(0), BLK(1) ... BLK(m) that are arranged in a column direction. In this embodiment, the page buffer/sensing circuit 160 is disposed at an end of the blocks. Nevertheless, the invention is not limited thereto. In another embodiment, the page buffer/sensing circuit 160 may be disposed at the other end or both ends of the blocks.

With reference to FIG. 1 and FIG. 3, n+1 cell units NU are arranged along a row direction in one memory block. The cell unit NU includes: a plurality of memory cells MCi (i=0, 1, ..., 31) that are connected in series; a bit line selection transistor TD disposed at an end of the cell unit NU and connected to a drain side of the memory cell MC31; and a source line selection transistor TS disposed at the other end of the cell unit NU and connected to a source side of the memory cell MC0. A drain of the bit line selection transistor TD is connected to a corresponding bit line BL, and a source of the source line selection transistor TS is connected to a common source line SL.

Control gates of the memory cells MCi are connected to the corresponding word lines WLi; gates of the bit line selection transistor TD and the source line selection transistor TS are respectively connected to selection gate lines SGD and SGS parallel to the word lines WL. When the word line selection circuit 150 selects the memory block based on the row address Ax, the bit line selection transistor TD and the source line selection transistor TS are selectively driven via the selection gate lines SGS and SGD of the memory block.

The memory cell has the same configuration as the general flash memory. That is, the memory cell includes a source/drain having an N-type diffusion region formed in a P-well; a tunneling oxide layer formed on a channel between the source/drain; a floating gate (charge accumulation layer) formed on the tunneling oxide layer; and a control gate formed on the floating gate via a dielectric film. When the floating gate is not accumulated with charges or charges are erased, namely, data "1" is written, the threshold value is negative, and the memory cell is normally on. When charges are accumulated in the floating gate, namely, data "0" is written, the threshold value shifts toward a positive direction, and the memory cell is normally off.

The invention provides a programming method for a flash memory. In the conventional programming method, electrons from a substrate are injected into the floating gate for programming through FN tunneling. In contrast, the programming method of the invention is to inject hot electrons from the substrate into the floating gate for programming.

Figure 4:
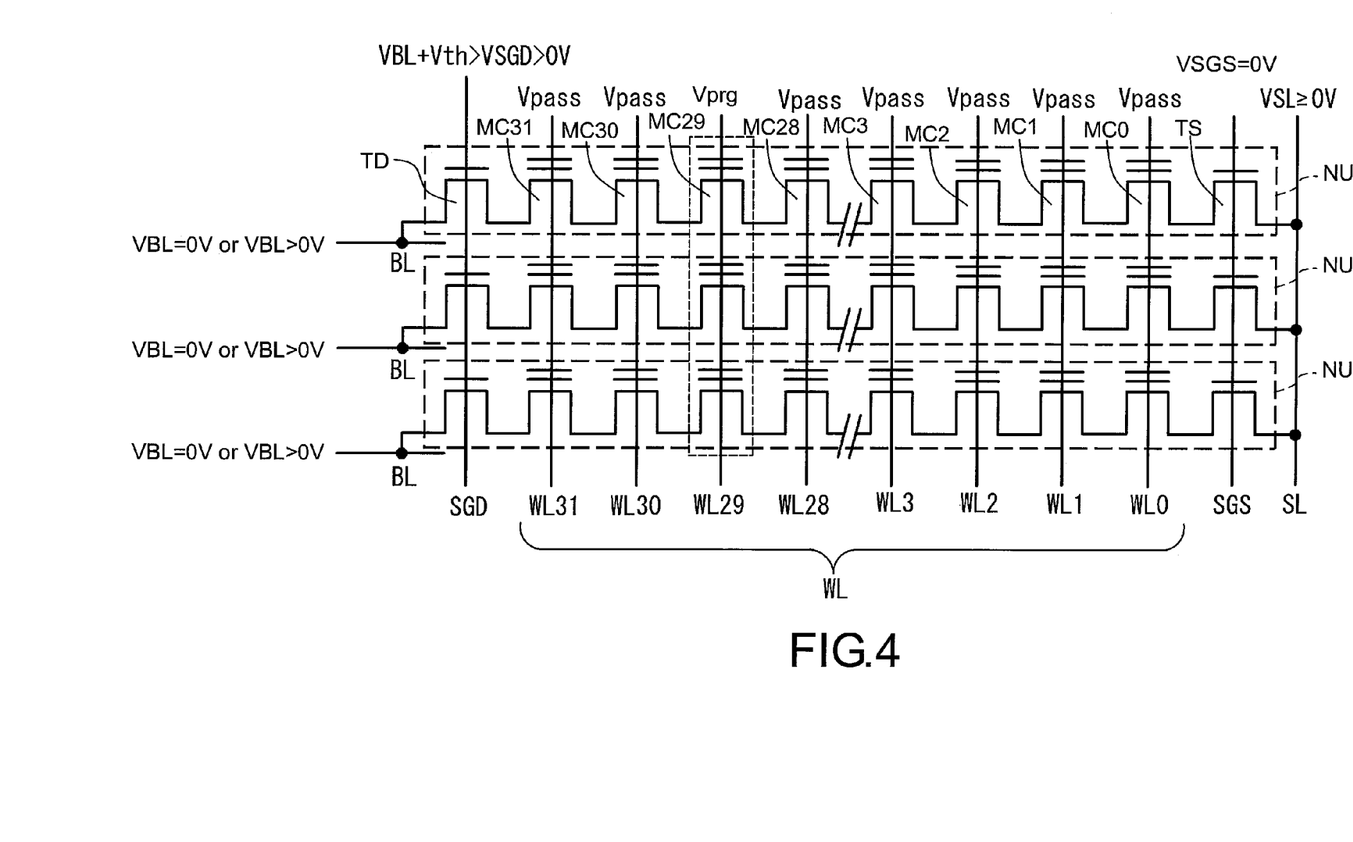
FIG. 4 is a schematic diagram illustrating voltages applied to the respective parts when a programming operation is performed on a flash memory of the first embodiment of the invention.
Figure 5:
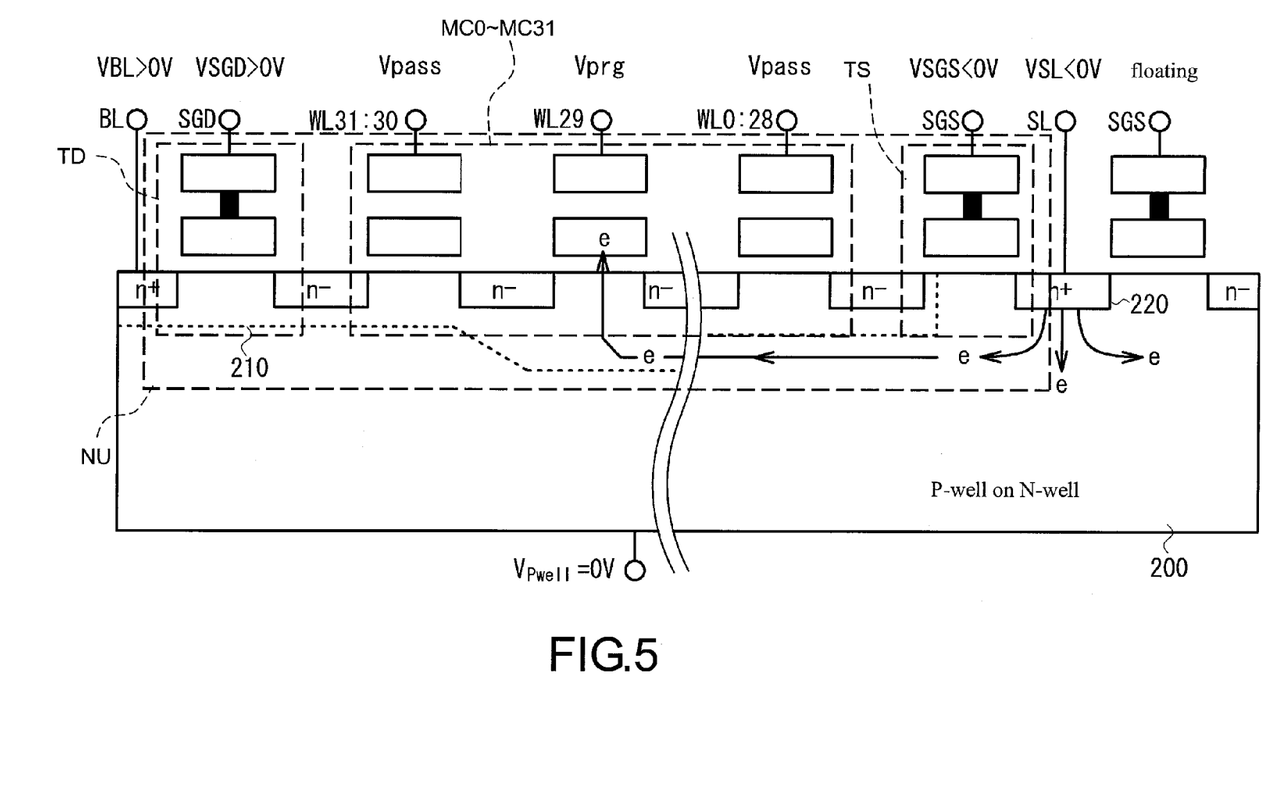
FIG. 5 is a schematic cross-sectional diagram of a cell unit including programming units of FIG. 4.
Figure 6:
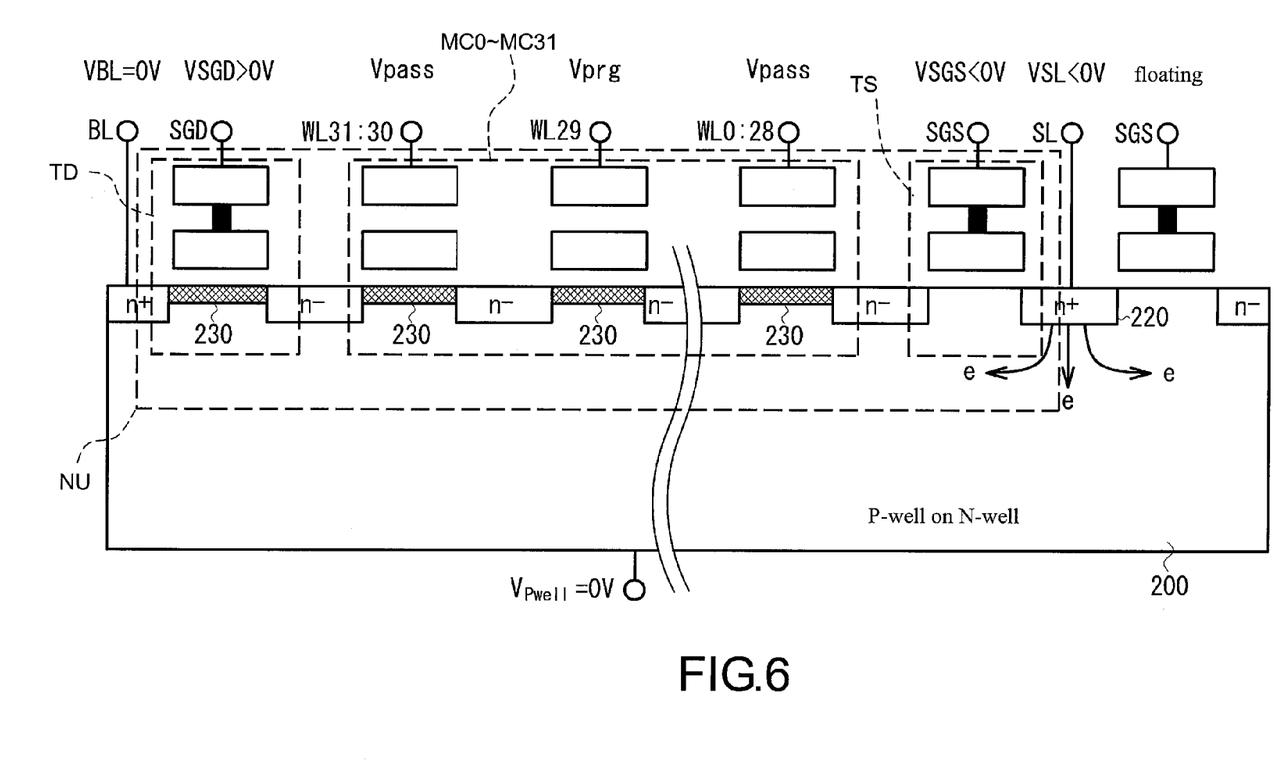
FIG. 6 is a schematic cross-sectional diagram of a cell unit not including programming units of FIG. 4.
Figure 7:
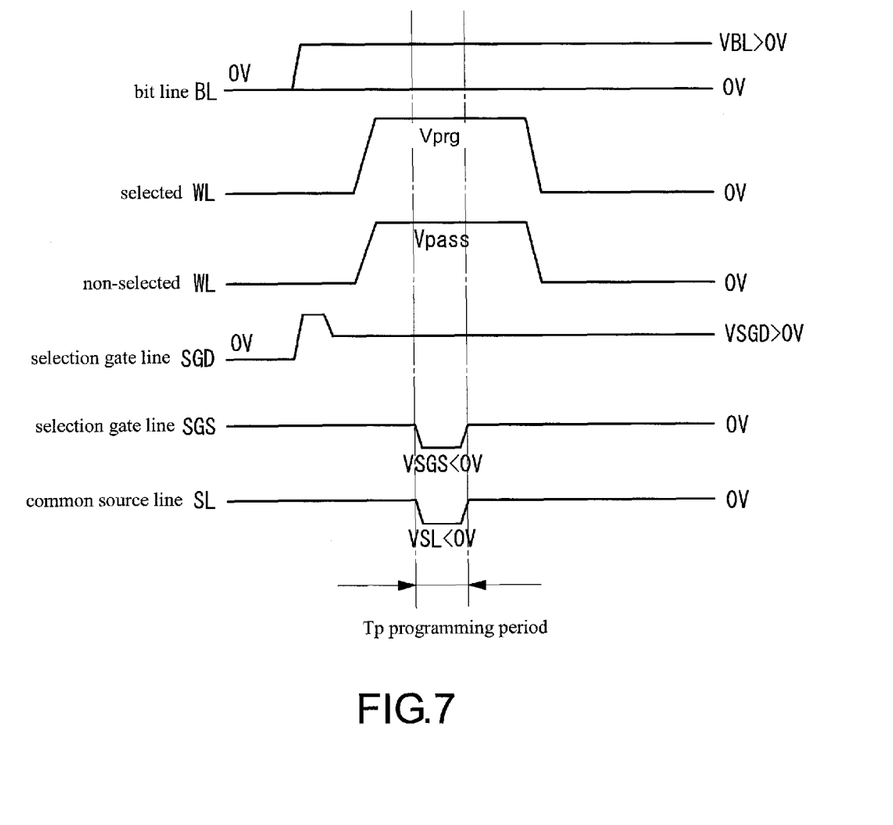
FIG. 7 is a timing diagram of the programming operation of FIG. 4.

The first embodiment of a programming operation of the flash memory according to the invention is described hereinafter. FIG. 4 is a schematic diagram illustrating voltages applied to the respective parts when the programming operation is performed on the flash memory of the first embodiment of the invention. FIG. 5 is a schematic cross-sectional diagram of a cell unit NU including memory cells that are to be programmed (collectively referred to as "programming units") in FIG. 4. FIG. 6 is a schematic cross-sectional diagram of a cell unit NU not including programming units in FIG. 4. FIG. 7 is a timing diagram of the programming operation of FIG. 4.

With reference to FIG. 4 to FIG. 6, in the flash memory of this embodiment, a P-well semiconductor region 200 is formed on an N-type silicon substrate or an N-well semiconductor region. When performing the programming, the P-well is applied with 0V. A cell unit NU, formed by connecting NMOS transistors in series, is formed in the P-well 200. That is, the bit line selection transistor TD, the memory cells MC0~MC31, and the source line selection transistor TS are formed. The control gate of the bit line selection transistor TD is electrically coupled with the floating gate; the selection gate line SGD is coupled to the control gate of the bit line selection transistor TD; the bit line BL is coupled to the drain region of the bit line selection transistor TD; and the source region of the bit line selection transistor TD is further used as the drain region of the memory cell MC31. The word lines WL0~WL31 are respectively coupled to the control gates of the memory cells MC0~MC31. The control gate of the source line selection transistor TS is electrically coupled with the floating gate. The selection gate line SGS is coupled to the control gate of the source line selection transistor TS. The drain region of the source line selection transistor TS is further used as the source region of the memory cell MC0. The common source line SL is coupled to the source region of the source line selection transistor TS.

FIG. 4 illustrates an example of selecting the word line WL29 in the selected block and performing programming on the page thereof. With reference to FIG. 4, the selection gate line SGD of the bit line selection transistor TD is applied with a positive potential (i.e. VSGD>0V), and the selection gate line SGS of the source line selection transistor TS is applied with 0V (VSGS=0V). The bit line BL corresponding to the cell unit NU including programming units is applied with a positive potential (VBL>0V), and the bit line BL corresponding to the cell unit NU not including programming units is applied with 0V (VBL=0V). The common source line SL is applied with 0V or a positive potential, e.g. 1.2V.

Here, a relationship between the voltage VSGD applied to the selection gate line SGD and the voltage VBL applied to the bit line is set as follows. That is, the setting is to turn off the bit line selection transistor TD corresponding to the cell unit NU including programming units and turn on the bit line selection transistor TD corresponding to the cell unit NU not including programming units. More specifically, the voltage VSGD applied to the selection gate line SGD is set to be VBL+Vth>VSGD>0V. Here, Vth is a threshold value of the bit line selection transistor TD. Therefore, the bit line selection transistor TD connected with the bit line applied with VBL>0V is turned off, and the bit line selection transistor TD connected with the bit line applied with VBL=0V is turned on. Hence, the source line selection transistor TS is turned off, and accordingly, the cell unit NU including programming units is electrically cut off from the bit line BL and the common source line SL, and the cell unit NU not including programming units is electrically coupled with the bit line BL.

The selected word line WL29 is applied with a higher programming voltage Vprg. The programming voltage Vprg may be a programming voltage (e.g. a voltage lower than 20V) that is applied in the conventional flash memory. The non-selected word line WL is applied with the pass voltage Vpass. The pass voltage Vpass is lower than the programming voltage Vprg and greater than 0V, and is sufficient to turn on the memory cell holding the data "0". At the same time, the potential of the word line WL29 rises through the programming voltage Vprg, and thereby the potential of a silicon surface of this programming unit is booted to rise. In addition, through applying the pass voltage, the potential of the silicon surface of the memory cell connected to the non-selected word line also rises slightly. Thus, as shown in FIG. 5, the cell unit NU including programming units is floating-connected, and therefore a depletion region 210 is formed near the bit line selection transistor TD, the channel of the memory cell MC0~MC31, and the source/drain regions.

On the other hand, in the cell unit NU not including programming units, the bit line BL is applied with 0V (VBL=0) so as to turn on the bit line selection transistor TD. Therefore, through the programming voltage Vprg applied to the selected word lines and the pass voltage Vpass applied to the non-selected word lines, an inversion layer 230 is formed. The potential of the channel of the memory cells in the cell unit NU becomes 0V, the same as the potential of the bit line. No depletion region is formed in the channel of the cell unit NU not including the programming units.

Next, as illustrated in FIG. 7, the common source line SL is applied with a negative voltage (VSL<0V), and the selection gate line SGS is applied with a negative voltage (VSGS<0V). In a preferable embodiment, programming periods Tp of applying negative voltages to the common source line SL and the selection gate line SGS are the same. Alternatively, the selection gate line SGS may be applied with a negative voltage at the beginning of the programming. With reference to FIG. 5 and FIG. 7, a contact region 220 coupled with the common source line SL is applied with a negative voltage, so as to form a forward bias between the contact region 220 and the P-well (Vp-well=0V), and electrons flow from the contact region 220 to the P-well. Meanwhile, the selection gate line SGS is applied with a negative voltage so as to turn off the source line selection transistor TS. The electrons flowing from the contact region 220 are diffused in the P-well 200 and reach the programming units. At the same time, the potential of the silicon surface of the programming units rises and forms the depletion region 210 here. Therefore, the electrons pass through an electric field thereof and accelerate in energy and become hot electrons, and then cross the gate oxide layer to be injected into the floating gate (charge storage layer). If the acceleration energy of the electrons is higher than a barrier of the oxide layer, even if the electric field of the oxide layer is not very high, the electrons may be injected into the charge storage layer, thereby through the electric field of the oxide layer is reduced, the deterioration of the oxide layer is suppressed. Thereafter, with reference to FIG. 6 and FIG. 7, because no depletion region is formed in the cell unit not including programming units, no hot electrons are generated. Moreover, if the programming voltage Vprg applied to the selected word line WL29 is not very high, electron injection, resulting from FN tunneling, does not occur in the charge storage layer of the corresponding memory cell.

In an erasing operation of the flash memory, a high-voltage erase voltage is applied to the P-well of the selected block, and all the word lines in the block are applied with 0V. Meanwhile, the electrons holding in the charge storage layer are released to the silicon surface through the oxide layer between the silicon surface and the charge storage layer. However, during the erasing operation, if the electric field of the oxide layer is high, the reliability of the oxide layer of the memory cell may deteriorate. If the erasing time is prolonged to reduce the electric field for the oxide layer, deterioration of the reliability of the oxide layer is reduced. For example, if the erasing time is about 0.1 sec, the electric field of the oxide layer is reduced to around ⅔, which suppresses deterioration of the reliability of the oxide layer.

Moreover, in the above embodiment, although the diffusion region 220 connected with the common source line SL is applied with a negative voltage, the negative voltage is not necessarily applied through the common source line SL. For instance, other N-type diffusion regions may be formed in the P-well 200, and the diffusion region may be applied with a negative voltage for generation of the forward bias. In such a case, there is no need to apply a negative bias to the common source line SL.

Figure 8:
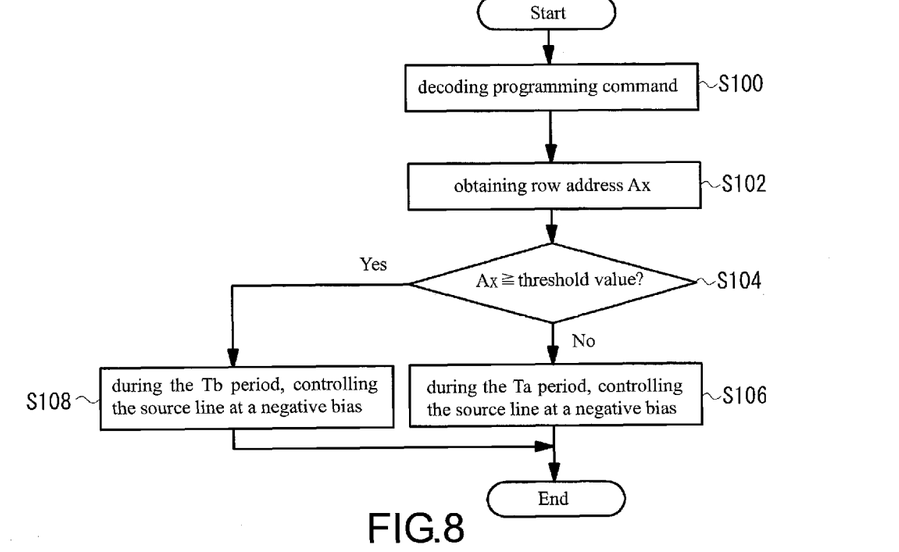
FIG. 8 is a flowchart of performing a programming operation on a flash memory according to the second embodiment of the invention.

Next, a programming operation for a flash memory according to the second embodiment of the invention is described hereinafter. FIG. 8 is a flowchart of performing the programming operation on the flash memory according to the second embodiment of the invention. The programming operation is executed for example through the controller 140 (FIG. 3). With reference to FIG. 8, the controller 140 receives a programming command and decodes the command (S100) to start programming. The row address Ax for performing the programming is obtained from the address information that is received after the programming command (S102), so as to determine whether the row address Ax is greater than a threshold value (S104). The threshold value is set according to the number of the memory cells that constitute the cell unit NU. For example, if the cell unit NU has 32 memory cells, the threshold value may be set to half of the number of the memory cells (i.e. 16), for example. In other words, it is to determine whether a distance between the programming units and the source line is greater than half of the number of the memory cells.

Figure 9A:
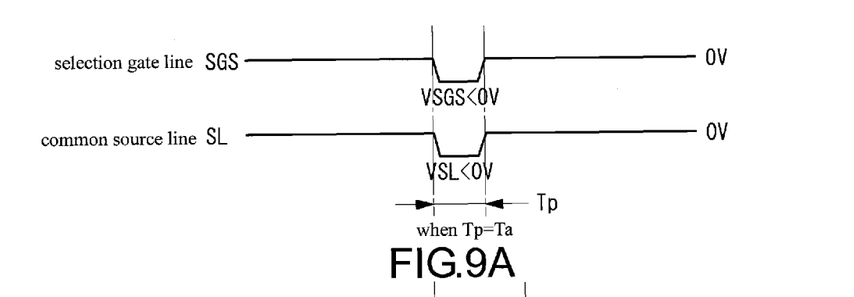
FIG. 9A and FIG. 9B are schematic diagrams illustrating programming periods Ta and Tb in the second embodiment of the invention.
Figure 9B:
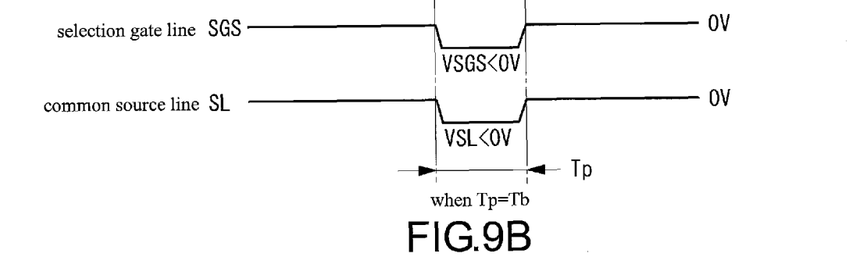

With reference to FIG. 9A, before the row address Ax reaches the threshold value, namely, being relatively close to the common source line SL, the controller 140 sets the programming period for applying a negative bias to the common source line SL to be Tp=Ta (S106 of FIG. 8). On the other hand, with reference to FIG. 9B, when the row address Ax is greater than the threshold value, namely, being relatively far away from the common source line SL, the programming period for applying a negative bias to the common source line SL is set to be Tp=Tb (Tb>Ta) (S108 of FIG. 8). In a situation that the position of the programming unit is away from the common source line SL, a distance or time of diffusion of the electrons becomes longer. Hence, by setting the programming periods Ta and Tb corresponding to the diffusion distance to suppress non-uniformity of the injection amount of the electrons to the programming unit, a distribution width of the threshold value of the memory cell is narrowed.

In the above embodiment, the programming periods Ta and Tb are set according to whether the row address Ax is greater than the threshold value. However, the programming periods may be further divided. For example, if the number of the memory cells included in the cell unit NU is as large as 64 or 128, a difference in the diffusion distance from the source line to the programming unit becomes greater. Therefore, multiple threshold values may be prepared, for example, for determining the row address Ax conforms to which of the four groups of words lines (namely, word lines WL0~WL15, word lines WL16~WL31, word lines WL32~WL47, and word lines WL48~WL63), and selecting a corresponding programming period from four programming periods Ta<Tb<Tc<Td.

Figure 10A:
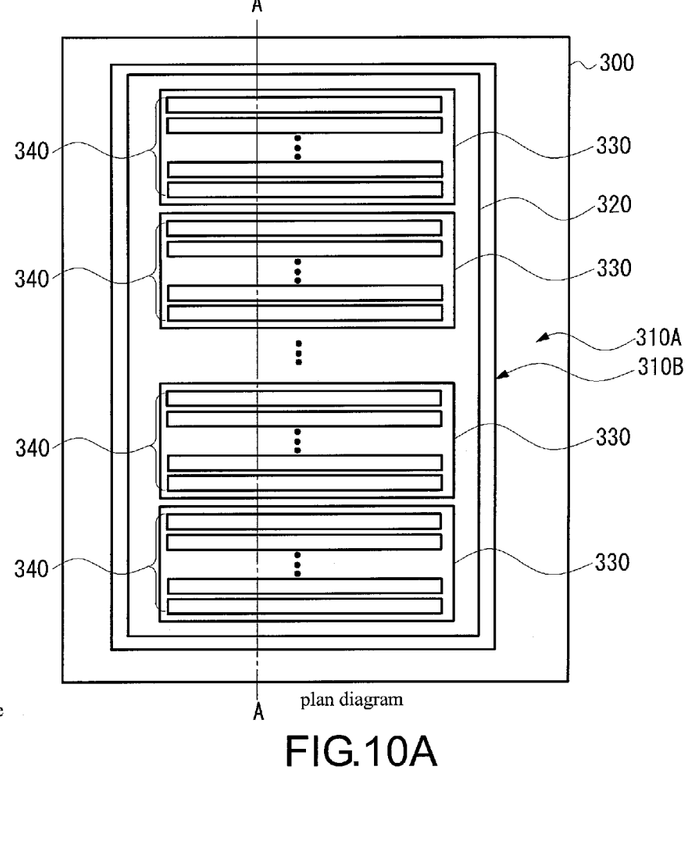
FIG. 10A is a schematic plan diagram of a chip of a flash memory according to the third embodiment of the invention.
Figure 10B:
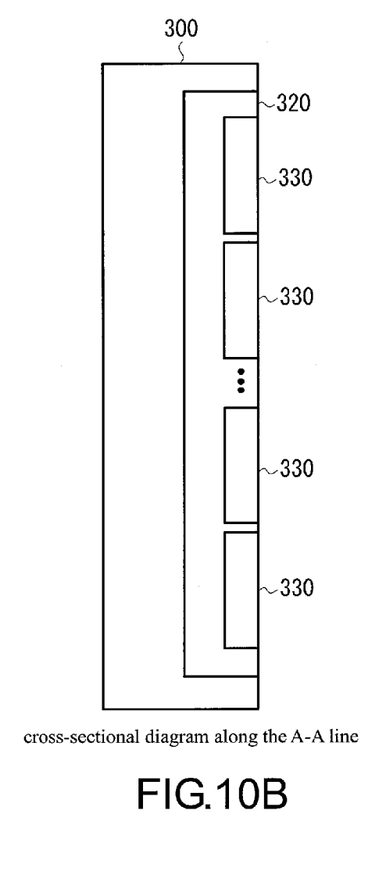
FIG. 10B is a partially enlarged cross-sectional diagram along the line A-A of FIG. 10A.

Next, the third embodiment of the invention is explained below. FIG. 10A is a schematic plan diagram of a chip of a flash memory according to the third embodiment of the invention. FIG. 10B is a partially enlarged diagram along the line A-A of FIG. 10A. With reference to FIG. 3 and FIG. 10A, in a peripheral region 310A of a substrate 300, the address register 120, the data register 130, the controller 140, the word line selection circuit 150, the page buffer/sensing circuit 160, the column selection circuit 170, and the internal voltage generating circuit 180 and so on are formed. The substrate 300 is a P-type silicon substrate, for example. The memory array 100 is formed in an array region 310B. In the array region 310B, an N-well region 320 is formed on the substrate 300, and a P-well region 330 is formed in the N-well region 320. A method for forming the N-well region 320 and the P-well region 330 includes an ion implantation process, for example. The P-well region 330 defines a memory block 340, in which a plurality of cell units NU as shown in FIG. 1 are disposed.

Figure 11:
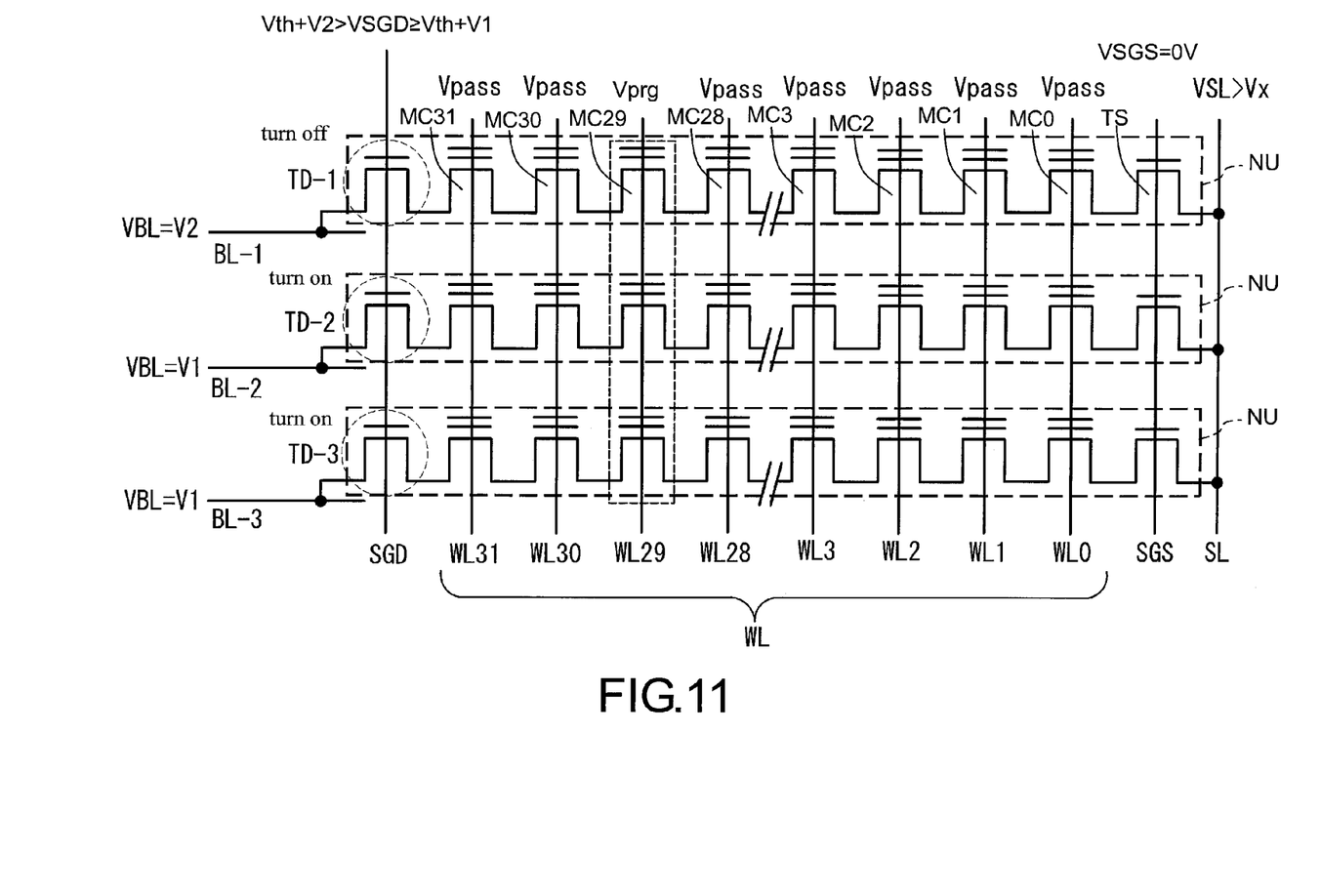
FIG. 11 is a schematic diagram illustrating voltages applied to the respective parts when a programming operation is performed in the third embodiment of the invention.
Figure 12:
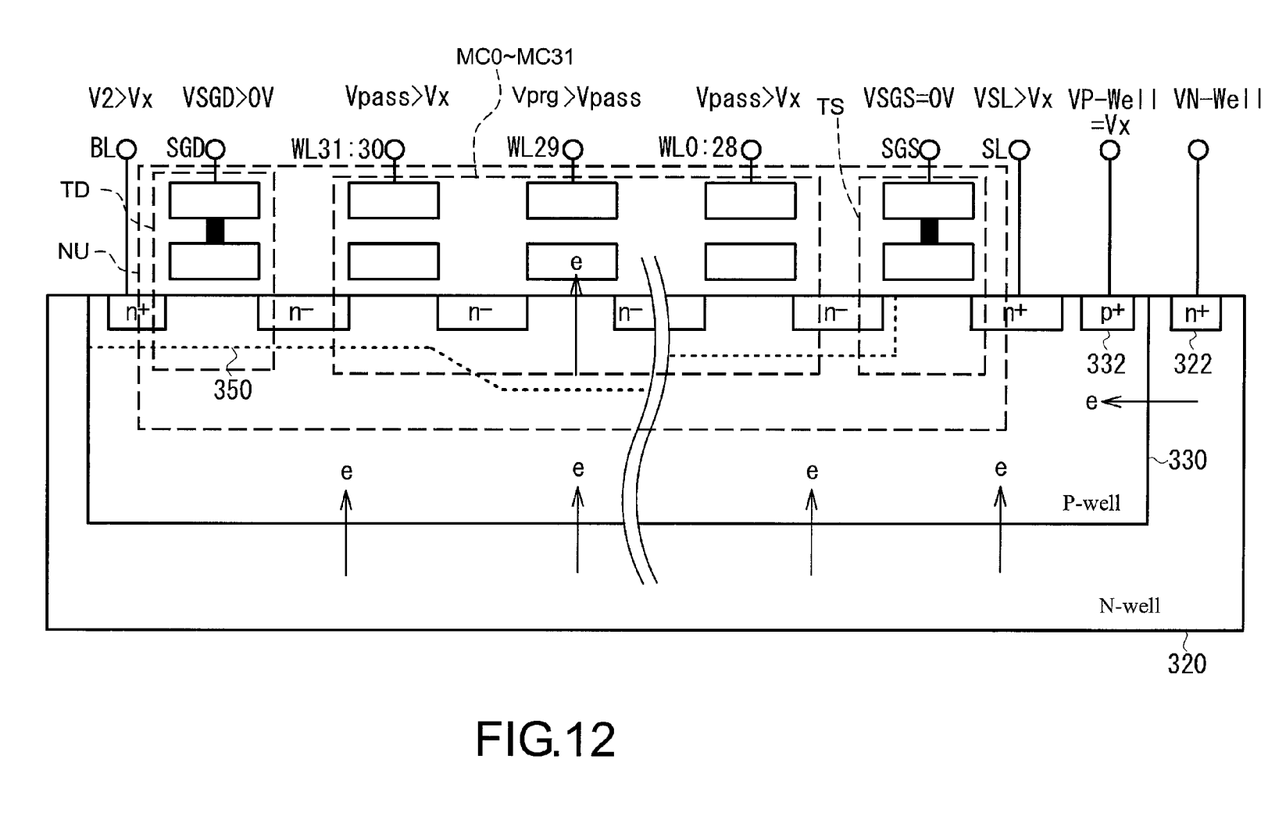
FIG. 12 is a schematic cross-sectional diagram illustrating a programming operation of a bit line BL-1 of FIG. 11.
Figure 13:
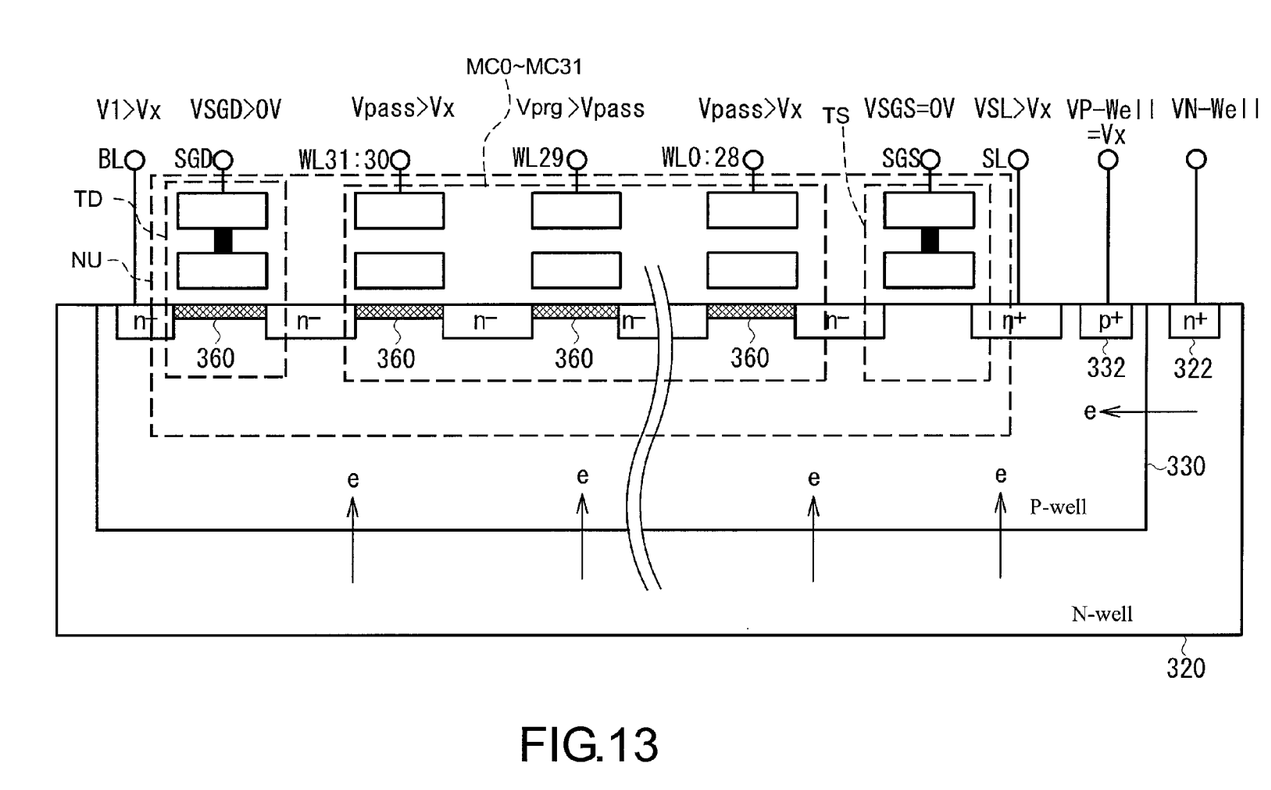
FIG. 13 is a schematic cross-sectional diagram illustrating a state of a bit line BL-2 of FIG. 11.
Figure 14:
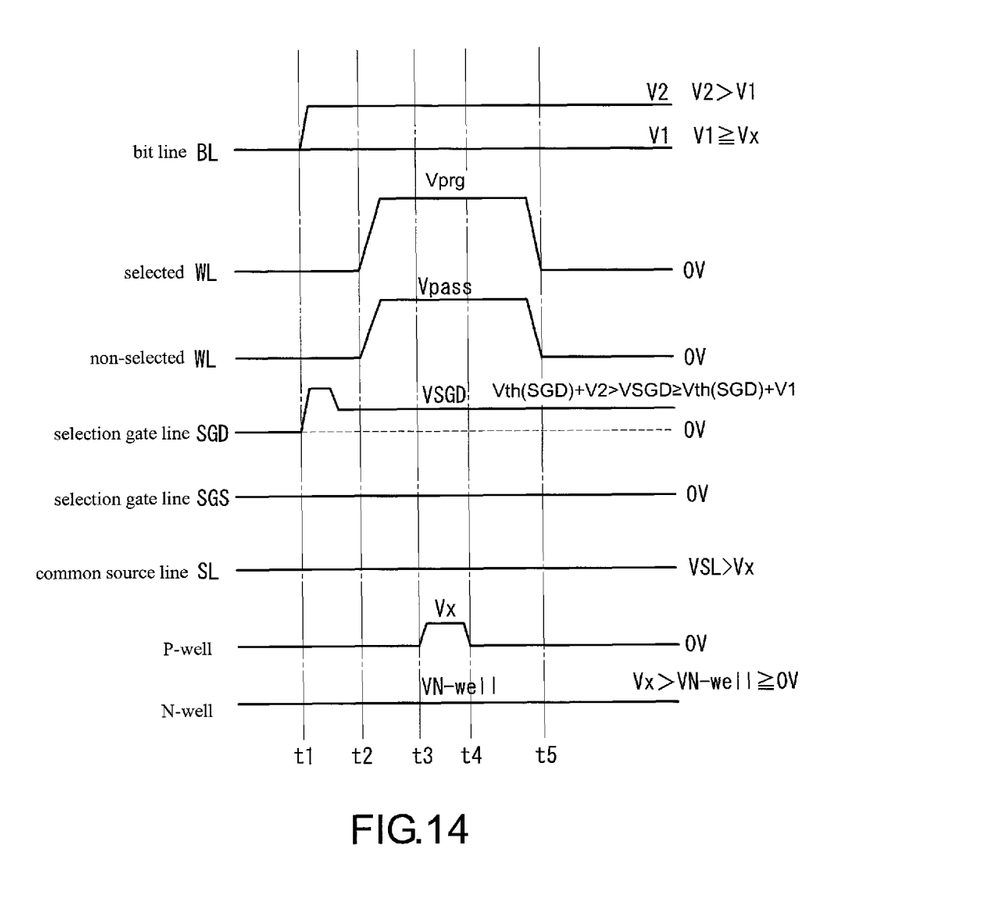
FIG. 14 is a timing diagram of the programming operation of FIG. 11.

FIG. 11 is a schematic diagram illustrating voltages applied to the respective parts when a programming operation is performed in the third embodiment of the invention. FIG. 12 is a schematic cross-sectional diagram illustrating a programming operation of a bit line BL-1 of FIG. 11. FIG. 13 is a schematic cross-sectional diagram illustrating a state of a bit line BL-2 of FIG. 11. FIG. 14 is a timing diagram of the programming operation of FIG. 11.

With reference to FIG. 14, at a timing t1, the bit line corresponding to the cell unit including programming units is applied with V2, and the bit line corresponding to the cell unit not including programming units is applied with V1. In a preferable embodiment, V1 is a potential equal to or higher than a potential Vx of the forward bias applied to the P-well region 330 during programming (V1≥Vx), and V2 is a potential higher than V1 (V2>V1). At the timing t1, the P-well region 330 is applied with 0V, and the N-well region 320 is applied with a potential of VN-well. Preferably, the potential of VN-well satisfies Vx>VN-well≥0V.

Further referring to FIG. 14, approximately at the timing of applying V1 or V2 potential to the bit line BL, the selection gate line SGD of the bit line selection transistor TD of the selected block is applied with a positive potential (i.e. VSGD>0V), and the selection gate line SGS of the source line selection transistor TS is applied with 0V (VSGS=0V). A relationship between the potential VSGD applied to the selection gate line SGD and the potential V1, V2 applied to the bit line is set such that: the bit line selection transistor TD corresponding to the bit line applied with V2 is turned off, and the bit line selection transistor TD corresponding to the bit line applied with V1 is turned on. More specifically, the potential VSGD of the selection gate line SGD of the bit line selection transistor TD is set to be Vth+V1≤Vth+V2. Here, Vth is the threshold value of the bit line selection transistor TD. Therefore, the bit line selection transistor TD connected with the bit line applied with V2 is turned off, and the bit line selection transistor TD connected with the bit line applied with V1 is turned on. Moreover, the source line selection transistor TS is turned off. Hence, the cell unit NU corresponding to the bit line applied with V2 is electrically cut off from the bit line BL and the common source line SL, and the cell unit NU corresponding to the bit line applied with V1 is electrically coupled with the bit line BL.

FIG. 11 is a schematic diagram illustrating voltages applied to the respective parts when the programming operation is performed in the third embodiment of the invention. With reference to FIG. 11, the bit line BL-1 is applied with V2, so as to turn off the bit line selection transistor TD-1 connected with the bit line BL-1. At this moment, the corresponding cell unit NU is floating-connected. On the other hand, the bit lines BL-2 and BL-3 are applied with V1, so as to turn on the bit line selection transistors TD-2 and TD-3 connected with the bit lines BL-2 and BL-3. At this moment, the corresponding cell units NU is electrically connected with the bit lines BL-2 and BL-3.

Then, at a timing t2, the selected word line is applied with the higher programming voltage Vprg, and the non-selected word line is applied with the pass voltage Vpass. The programming voltage Vprg and the pass voltage Vpass are applied till a timing t5. Herein, the programming voltage Vprg may be a programming voltage (e.g. a voltage lower than 20V) that is applied in the conventional flash memory. Moreover, the pass voltage Vpass is lower than the programming voltage Vprg, and is a potential sufficient to turn on the memory cell holding the data "0". As shown in FIG. 11, the selected word line WL29 is applied with the programming voltage Vprg, and other non-selected word line is applied with the pass voltage Vpass.

From a timing t3 to a timing t4 during the period of applying the programming voltage Vprg and the pass voltage Vpass, the P-well region 330 is applied with the potential Vx, higher than the N-well region 320, to form a forward bias. Accordingly, data "0" is written to the selected programming unit.

FIG. 12 is a schematic cross-sectional diagram illustrating the programming operation of the bit line BL-1 of FIG. 11. With reference to FIG. 12, a contact region 322 of the N-well region 320 is applied with the potential VN-well, and a contact region 332 of the P-well region 330 is applied with the potential Vx higher than VN-well, such that the forward bias is formed at a junction between the P-well region 330 and the N-well region 320, and electrons are injected to the P-well region 330 from the N-well region 320. Meanwhile, the cell unit NU corresponding to the bit line applied with the potential V2 is in a floating state. Hence, the potential of the silicon surface of the programming unit applied with the programming voltage Vprg rises. In addition, the potential of the silicon surface of the memory cell applied with the pass voltage Vpass also rises slightly. Thus, as shown in FIG. 12, a depletion region 350 is formed in the channel of the memory cells MC0~MC31 corresponding to the bit line applied with V2. Meanwhile, some electrons that are injected to the P-well region 330 from the N-well region 320 are accelerated by the electric field in the depletion region 350 deep in the channel of the programming unit and are injected to the floating gate (charge storage layer) of the programming unit. Accordingly, the threshold value of the programming unit shifts in the positive direction, and data "0" is written.

FIG. 13 is a schematic cross-sectional diagram illustrating the state of the bit line BL-2 of FIG. 11. During the period of applying the potential Vx to the P-well region 330, same as the situation of FIG. 12, electrons are injected to the P-well region 330 from the N-well region 320. In a situation that the bit line BL-2 is applied with the potential V1, the bit line selection transistor TD-2 becomes an on state. Thus, an inversion layer 360 is formed in the channel of the memory cells of the cell unit NU, and the potential of the channel becomes the same as the potential V1. When some electrons from the N-well region 320 come near the channel of the memory cells applied with the programming voltage Vprg (corresponding to the word line WL29), since no depletion region is formed in the channel, the electrons are not accelerated by the electric field. Therefore, the electrons are not injected into the floating gate of the memory cells corresponding to the selected word line WL29. Hence, the threshold value remains unchanged and is the data "1".

In this embodiment, division is performed through the P-well region 330 in the array region 310B, such that the potential of the P-well region including the selected block is positive with respect to the N-well region 320 when programming the selected block. Moreover, other P-well regions are fixed to 0V during the programming, so as to reduce a forward current flowing from the N-well region 320 to the P-well region 330.

The first to the third embodiments have been described in detail above. It should be noted that the invention not only includes the first to the third embodiments but also includes a combination of any of the first to the third embodiments. For example, the third embodiment may be the same as the situation of the second embodiment that the period of applying the forward bias to the P-well region 330 is changed according to the position of the row address for the programming.

Exemplary embodiments of the invention have been disclosed above. Nevertheless, it should be understood that the invention is not limited to any of the above exemplary embodiments, and various modifications or alterations can be made to the disclosed embodiments without departing from the scope or spirit of the invention. In view of the foregoing, it is intended that the invention covers modifications and variations of this disclosure provided that they fall within the scope of the following claims and their equivalents.

What is claimed is:

1. A programming method, adapted for a flash memory that comprises a memory array having a plurality of NAND type cell units formed in a first semiconductor region of a first conductive type, the programming method comprising:
   electrically isolating the cell unit comprising a programming unit from a bit line corresponding thereto, and electrically coupling the cell unit not comprising the programming unit with a bit line corresponding thereto;
   applying a programming voltage to a selected word line, and applying a pass voltage to a non-selected word line;
   generating carriers in the first semiconductor region during a period of applying the programming voltage; and
   injecting hot carriers into the programming unit,
   wherein applying the programming voltage to the selected word line, applying the pass voltage to the non-selected word line, generating the carriers in the first semiconductor region, and injecting the hot carriers are all carried out while the cell unit comprising the programming unit is electrically isolated from the bit line corresponding thereto and the cell unit not comprising the programming unit is electrically coupled with the bit line corresponding thereto.

2. The programming method according to claim 1, wherein the step of generating the carriers comprises causing the first semiconductor region to form a forward bias.

3. The programming method according to claim 2, wherein the step of forming the forward bias comprises:
   applying a first voltage to the first semiconductor region; and
   applying a second voltage to a second semiconductor region formed in the first semiconductor region,
   wherein the second voltage is greater than the first voltage.

4. The programming method according to claim 1, further comprising:
   forming the first semiconductor region on a P type silicon substrate; and
   forming a plurality of second semiconductor regions of a second conductive type in the first semiconductor region,
   wherein the first conductive type is N type, and the second conductive type is P type.

5. The programming method according to claim 4, wherein the second semiconductor region, which comprises the programming unit among the plurality of second semiconductor regions, is applied with a potential higher than the first semiconductor region.

6. The programming method according to claim 1, wherein an end of the cell unit is connected to the bit line corresponding thereto via a bit line selection transistor; the other end thereof is connected to a source line via a source line selection transistor; the cell unit comprising the programming unit is electrically isolated from the bit line and the source line by turning off the bit line selection transistor and the source line selection transistor; and the cell unit not comprising the programming unit is electrically coupled with the bit line by turning on the bit line selection transistor.

7. The programming method according to claim 6, wherein the bit line corresponding to the cell unit comprising the programming unit is applied with a first potential, the bit line corresponding to the cell unit not comprising the programming unit is applied with a second potential, and a gate of the bit line selection transistor is applied with a third potential, wherein the first potential is greater than the second potential, and the third potential is between the first potential and the second potential.

8. The programming method according to claim 6, wherein a voltage for generating the forward bias is applied to a diffusion region of the source line selection transistor.

9. The programming method according to claim 1, wherein the period of generating the carriers is changed according to a position of the selection word line.

10. The programming method according to claim 9, wherein the period of generating the carriers comprises a first period when the position of the selected word line is equal to or less than a first threshold value; and a second period that is greater than the first period when the position of the selected word line is greater than the first threshold value.

11. The programming method according to claim 1, wherein a depletion region is formed in a channel of the programming unit.

12. A semiconductor memory device, comprising:
   a memory array formed in a first semiconductor region of a first conductive type; and
   a plurality of cell units formed in the memory array, wherein the cell units comprise a plurality of memory cells that are connected in series, and one of the cell units comprises a programming unit that has been programmed,
   wherein, in a programming period, the cell unit comprising the programming unit is electrically isolated from a bit line corresponding thereto, the cell unit not comprising the programming unit is coupled with a bit line corresponding thereto, a selected word line is applied with a programming voltage, a non-selected word line is applied with a pass voltage, and carriers are generated in the first semiconductor region, wherein applying the programming voltage to the selected word line, applying the pass voltage to the non-selected word line, and generating the carriers in the first semiconductor region are all carried out while the cell unit comprising the programming unit is electrically isolated from the bit line corresponding thereto and the cell unit not comprising the programming unit is coupled with the bit line corresponding thereto; and
   during the programming period, a depletion region is formed in the cell unit comprising the programming unit, and the carriers forms hot carriers in the depletion region to be injected into the programming unit.

13. The semiconductor memory device according to claim 12, further comprising: a second semiconductor region of a second conductive type formed on a silicon substrate of the first conductive type, wherein the first semiconductor region is formed in the second semiconductor region.

14. The semiconductor memory device according to claim 13, wherein the carriers are generated by applying a forward bias to the first semiconductor region.

15. The semiconductor memory device according to claim 14, wherein the forward bias is applied by applying a higher voltage to the first semiconductor region than the second semiconductor region.

16. The semiconductor memory device according to claim 15, wherein a period of generating the carriers is set according to a position of the selected word line.

17. The semiconductor memory device according to claim 12, wherein an end of the cell unit is connected with the bit line corresponding thereto via a bit line selection transistor; the other end thereof is connected with a source line via a source line selection transistor; the cell unit comprising the programming unit is electrically isolated from the bit line and the source line by turning off the bit line selection transistor and the source line selection transistor; and the cell unit not comprising the programming unit is electrically coupled with the bit line by turning on the bit line selection transistor.

18. The semiconductor memory device according to claim 17, wherein the bit line corresponding to the cell unit comprising the programming unit is applied with a first potential, the bit line corresponding to the cell unit not comprising the programming unit is applied with a second potential, and a gate of the bit line selection transistor is applied with a third potential, wherein the first potential is greater than the second potential, and the third potential is between the first potential and the second potential.

* * * * *